US008916956B2

(12) United States Patent
Yu et al.

(10) Patent No.: US 8,916,956 B2
(45) Date of Patent: Dec. 23, 2014

(54) MULTIPLE DIE PACKAGING INTERPOSER STRUCTURE AND METHOD (71) Applicant: Taiwan Semiconductor Manufacturing Company, Ltd., Hsin-Chu (TW)

(72) Inventors: Chen-Hua Yu, Hsin-Chu (TW); Mirng-Ji Lii, Sinpu Township (TW); Hao-Yi Tsai, Hsin-Chu (TW); Jui-Pin Hung, Hsin-Chu (TW); Chien-Hsun Lee, Chu-tung Town (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/094,585

(22) Filed: Dec. 2, 2013

(65) Prior Publication Data

US 2014/0084459 A1    Mar. 27, 2014

Related U.S. Application Data (62) Division of application No. 13/539,182, filed on Jun. 29, 2012.

(51) Int. Cl.
*H01L 23/538* (2006.01)
*H01L 23/495* (2006.01)
*H01L 23/498* (2006.01)
*H01L 23/00* (2006.01)
*H01L 25/065* (2006.01)
*H01L 25/10* (2006.01)

(52) U.S. Cl.
CPC ... *H01L 23/5384* (2013.01); *H01L 2224/05655* (2013.01); *H01L 24/29* (2013.01); *H01L 24/32* (2013.01); *H01L 2924/15331* (2013.01); *H01L 25/0652* (2013.01); *H01L 2224/81005* (2013.01); *H01L 24/81* (2013.01); *H01L 2224/81455* (2013.01); *H01L 2224/05624* (2013.01); *H01L 2224/2919* (2013.01); *H01L 2225/1058* (2013.01); *H01L 2224/81466* (2013.01); *H01L 2224/05666* (2013.01); *H01L 2224/81471* (2013.01); *H01L 2224/05671* (2013.01); *H01L 2224/16225* (2013.01);

(Continued)

(58) Field of Classification Search
USPC .................. 257/668, 678–733, 787–796, 257/E23.001–E23.194
See application file for complete search history.

(56) References Cited

U.S. PATENT DOCUMENTS

| 6,884,707 | B1 | 4/2005 | Cherian |
| 8,020,290 | B2 | 9/2011 | Sheats |
| 8,703,539 | B2 | 4/2014 | Yu et al. |
| 2002/0140096 | A1 | 10/2002 | Higgins, III |

(Continued)

FOREIGN PATENT DOCUMENTS

| KR | 20080073677 A | 8/2008 |
| KR | 20080081125 A | 9/2008 |
| KR | 20110039396 A | 4/2011 |

*Primary Examiner* — Mamadou Diallo
(74) *Attorney, Agent, or Firm* — Slater & Matsil, L.L.P.

(57) ABSTRACT

System and method for providing a multiple die interposer structure. An embodiment comprises a plurality of interposer studs in a molded interposer, with a redirection layer on each side of the interposer. Additionally, the interposer studs may be initially attached to a conductive mounting plate by soldering or wirebond welding prior to molding the interposer, with the mounting plate etched to form one of the redirection layers. Integrated circuit dies may be attached to the redirection layers on each side of the interposer, and interlevel connection structures used to mount and electrically connect a top package having a third integrated circuit to the interposer assembly.

20 Claims, 10 Drawing Sheets (52) U.S. Cl.
CPC ............. *H01L 2224/73204* (2013.01); *H01L 2224/0401* (2013.01); *H01L 25/105* (2013.01); *H01L 24/73* (2013.01); *H01L 24/92* (2013.01); *H01L 24/05* (2013.01); *H01L 2924/19105* (2013.01); H01L 23/49822 (2013.01); H01L 24/97 (2013.01); *H01L 2224/81424* (2013.01); *H01L 2224/97* (2013.01); *H01L 2224/32225* (2013.01); H01L 23/49827 (2013.01); *H01L 2224/92125* (2013.01); *H01L 2924/15321* (2013.01); *H01L 2225/1023* (2013.01)

USPC ........... 257/668; 257/737; 257/777; 257/778; 257/E21.705; 257/E25.013

(56) References Cited

U.S. PATENT DOCUMENTS

| | | |
|---|---|---|
| 2008/0185719 A1 | 8/2008 | Cablao et al. |
| 2008/0211084 A1 | 9/2008 | Chow et al. |
| 2009/0166835 A1 | 7/2009 | Yang et al. |
| 2010/0061056 A1 | 3/2010 | Searls et al. |
| 2014/0001612 A1 | 1/2014 | Yu et al. |
| 2014/0004660 A1 | 1/2014 | Sung et al. |

MULTIPLE DIE PACKAGING INTERPOSER STRUCTURE AND METHOD

This application is a divisional of U.S. patent application Ser. No. 13/539,182, filed on Jun. 29, 2012, and entitled "Multiple Die Packaging Interposer Structure and Method," which application is hereby incorporated herein by reference.

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between ships, and subsequent interconnect distance.

One method used to reduce the distance between various chips forming a system is to stack chips, with interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces. These interposer substrates for flip chips are commonly silicon, glass or some other insulator with copper, gold or other conductors disposed in the vias through the interposer. While interposers providing through via connections provide improved device performance, they bring with them various manufacturing challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely wafer level packaging of integrated circuit dies. Other embodiments may also be applied, however, to other electrically connected components, including, but not limited to, bare chips without packaging, displays, input components, or any other desirable electrical component.

The present inventive concepts are directed to providing an interposer having pre-formed interposer studs and a dielectric material cast around preplaced interposer studs. Redirection layer (RDL) contacts may optionally be disposed on each side of the interposer, with one or more chips mounted on each side of the interposer such that the interposer studs, in combination with any RDL contacts.

Figure 1:
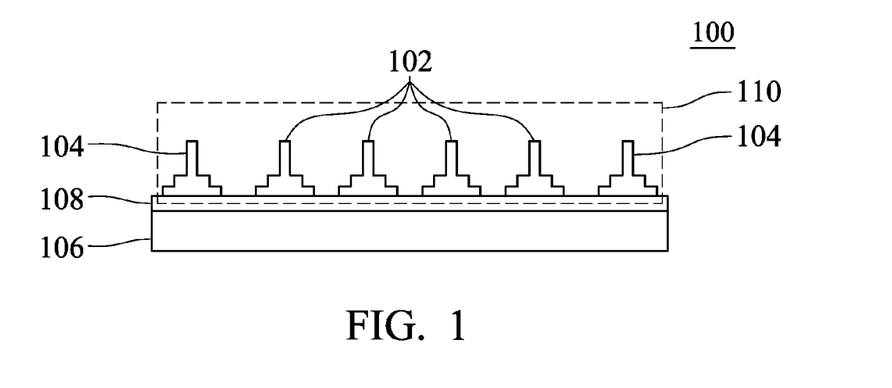
FIGS. 1-4 are diagrams illustrating the creation of an interposer assembly with interposer studs.

With reference now to FIG. 1, a diagram of an initial interposer assembly 100 is shown. The interposer assembly 100 is initially developed from one or more interposer studs 110. In one useful embodiment, the interposer studs 110 may advantageously be copper. Alternatively, interposer studs 110 may be made from gold, aluminum, or any other suitable conductor. The interposer studs may also be stamped from sheet material, extruded, cut from wire, molded, or formed using any single, or any combination of, known or as yet undiscovered techniques.

In the illustrated embodiment, the interposer studs 110 may be of multiple types, including board mounting studs 104 and device mounting studs 102. Such board mounting studs 104 may be used to connect a board on one side to a board on the opposite side. Similarly, the device mounting studs 102 may be used to connect pins for chips mounted on the top and bottom sides of the interposer. Alternatively, interposer studs may be used to connect any devices, components or any other element on opposite sides of the interposer.

Interposer studs 110 may be mounted on a mounting plate 108, which may in turn be mounted on a backup plate 106. In particularly useful embodiments, the mounting plate 108 may be a conductive sheet, with the interposer studs 110 soldered, welded, or otherwise conductively attached to mounting plate 108. In one embodiment, the interposer studs 110 may be formed integrally into the mounting plate 108. Such an arrangement may be constructed from a single piece of material, with the interposer studs formed by a material removal processes such as mechanical milling, plasma etching, chemical etching, ion milling or any other subtractive process. Alternatively, the interposer studs 110 may be milled separately and then placed on, and attached to, a mounting plate 108. In one particularly useful embodiment, the interposer studs 110 may be wire studs attached to the mounting plate 108 using a wire bonding machine employing a wire bonding technique such as a wedge bonding welding or ball bonding welding. Such embodiment may advantageously permit use of an existing piece of equipment handling known sizes of wire, and that can attach one end of the wire to the mounting plate 108. In an alternative, yet equally useful embodiment, the interposer studs 110 may be nails extruded from a desirable material, and then physically attached to the mounting plate 108 using solder paste.

Alternatively, the interposer studs 110 may be mounted directly to the backing plate 106 so that the bases of the interposer studs mate directly with the backing plate 106, and would be exposed when the backing plate 106 is removed in a later stage. The backing plate 108 may be glass or metal, or any other material sufficient to hold the mounting plate 108 and interposer studs 110 stationary while the interposer is constructed.

Figure 2:
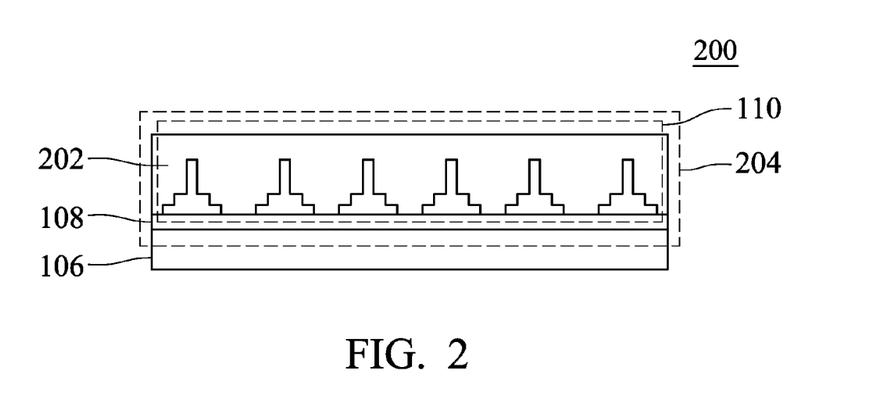

FIG. 2 illustrates an initial molded interposer 200 with interposer studs 110 disposed within a carrier plane 202. The backing plate 106 with attached mounting plate 108, if included, and interposer studs 110 may be placed into a molding chase. A molding material is used to fill the molding chase and form the carrier plane 202. In particularly useful embodiments, the molding material will be a material with electrical insulating properties sufficient to prevent electrical current from travelling between interposer studs. Glass, epoxy, silicon dioxide (SiO2), polymer, ceramic, or any other sufficiently insulating material may be advantageously used for the carrier plane. A molding material that liquefies when heated would preferably have a melting point lower than the material comprising the interposer studs 110 and mounting plate 108 so that the interposer studs 110 and mounting plate 108 remain unmelted when the molding material 202 is introduced into the molding chase. In one useful embodiment, a typical thickness for a carrier plane 202 may be 200-300 microns. However, this thickness may be varied depending on the electrical and physical properties desired in the interposer 204.

The molding material may advantageously also have flow properties permitting the material to flow around the interposer studs 110 and prevent any air bubbles or voids from forming in the carrier plane 202. These flow properties may be achieved through heating a meltable molding material to a point where the viscosity of the material permits the molding material to adequately fill the molding chase. Alternatively, a catalyzed or solvent based molding material may be used where the material is selected to have, or modified to have, a viscosity, surface tension, or other property permitting the complete filling of the molding chase.

In particularly useful embodiments, the carrier plane 202 may be formed from a thermal set epoxy commonly used for underfilling a die attached to a printed circuit board (PCB). Use of the same material for the underfilling and carrier plane 202 will allow close matching of the coefficient of thermal expansion (CTE), which is a measure of how much a particular material will expand for a given temperature. Additionally, the separation for a mounted die having underfilling is 40-100 microns from the interposer. An epoxy material configured to completely fill the space under the die, and around the pins, or connections underneath a mounted die will also be useful in completely filling the molding chase and any spaces around the interposer studs 110 without leaving bubbles or gaps.

In particularly useful embodiments, the molding chase may be shaped to give the interposer package its final shape. Thus, a square, rectangular, octagonal, hexagonal or round shape may be used. However, skilled artisans will recognize that any shape molding chase may be used without deviating from the principles described herein.

Alternatively, the molding chase may be in a shape not reflecting the final interposer package shape. In such an embodiment, the molding material of the carrier plane 202 may be shaped at some later point. Thus, multiple packages of interposer studs 110 may be attached to a single mounting plate 108, and placed into a single molding chase. After molding material is introduced to the molding chase and the carrier plane 202 solidifies, the carrier plane 202 may be cut or milled to a desired shape, for example, but not limited to, a shape providing more advantageous handling during processing, or to a final or intermediate desired shape. Alternatively, the carrier plane 202 with multiple interposer stud 110 packages may be further processed as a single piece and separated into individual interposer packages at a later stage.

After the carrier plane 202 is formed, the interposer 204 consists of at least the carrier plane 202 and one or more interposer studs 110. Where a mounting plate 108 is included in the molding process, the mounting plate is part of the interposer 204 as well.

Figure 3:
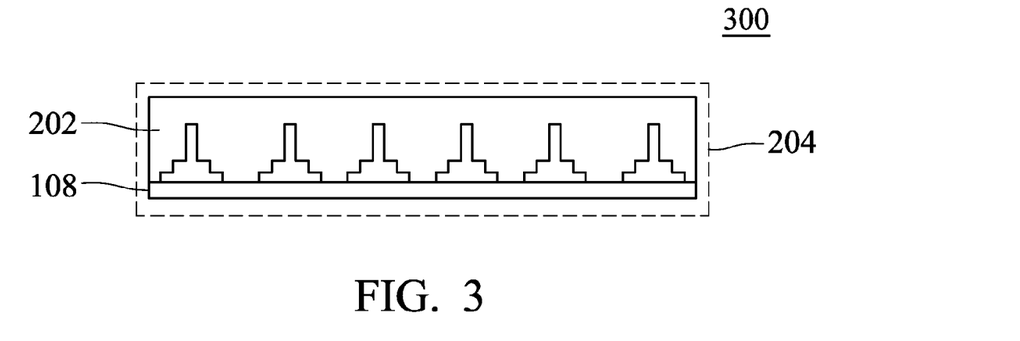

FIG. 3 illustrates an interposer 202 with the backup plate 106 removed 300. After the carrier plane 202 is formed, and the backup plate 106 is removed, a mounting plate 108, or other conductive material may be attached, if not already included, in the interposer 204. A conductive sheet may be deposited, or otherwise attached directly to the carrier plane 202 and interposer studs 110 so that the mounting plate 108 makes electrical contact with the interposer studs 110. The mounting plate 108, whether initially molded into the interposer 204, or attached after carrier plane 202 formation, may be processed to form discrete electrical connections between the interposer studs 110 and any desired mounting pads or other interposer studs 110.

Figure 4:
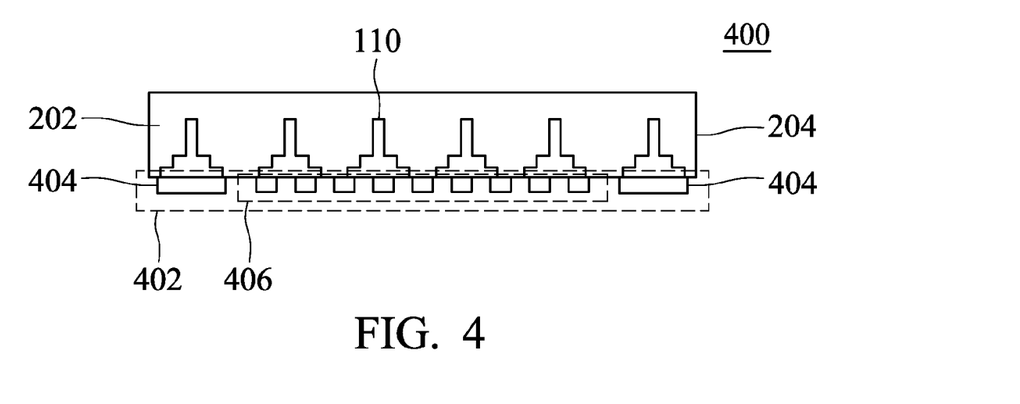

FIG. 4 illustrates a package with the interposer 202 including a bottom RDL structure 402. An RDL structure 402 may be used to redistribute the contact surfaces for each interposer stud 110. Alternatively, a conductive sheet may be bonded to the carrier plane 202 and interposer studs 110, and subsequently masked and etched to form the RDL structure 402. In one useful embodiment, the mounting plate 108 may be left in place and etched through any known or as yet undiscovered means to form the RDL structure 402. For example, photolithography may be used to mask a series of interconnects on the mounting plate 108, which may then in turn be etched to form the RDL structure 402. Alternatively, in an embodiment where no mounting plate 108 is used, and the interposer studs 110 are attached directly to the backup plate 106, an RDL structure 402 may be deposited on the bottom side of the carrier plane 202 after backup plate 106 removal. In such an embodiment, this may be accomplished by masking the features of the RDL structure 402 and then depositing the conductive material to form the RDL structure 402. In such an embodiment, the RDL structure 402 may be formed from any conductive material, by any formation processes, including, but not limited to or deposited by evaporation, electrolytic plating, electroless plating, screen printing, sputtering, CVD, or other suitable deposition process.

The RDL structure 402 permits the interposer 204 to remap the physical interconnections between chips, dies or other devices attached to the interposer 204. For example, an RDL trace may have a pin or contact for a die, device, board or other interposer, and a trace to a pad or contact connecting to an interposer stud 110, which in turn, may be connected to a RDL trace on the opposite side of the interposer 204. Thus, an RDL structure 402 may redirect the contacts for attached devices so that devices with pins that would not normally line up directly may be electrically connected.

Additionally, the RDL structure 402 may be comprised of different types or sizes of RDL pad. In one useful embodiment, the RDL structure may have RDL device mounting pads 406 or RDL board mounting pads 404. RDL device mounting pads 406 may be sized smaller to accept pins or contacts from a closely mounted device such as an integrated circuit die. Alternatively, RDL board mounting pads 404 may be larger than RDL device mounting pads 406, and configured to accept solder balls by which the interposer assembly may be attached to another board. For example a solder ball on an RDL board mounting pad 404 may be used to attach another device or board to the interposer assembly. Solder balls may be advantageously used for an electrical connection taller than a die mounted on the RDL device mounting pads 406, permitting the interposer structure to mount devices or boards at two different layers, or levels, on a single side of the interposer 204 carrier plane 202.

Figure 5:
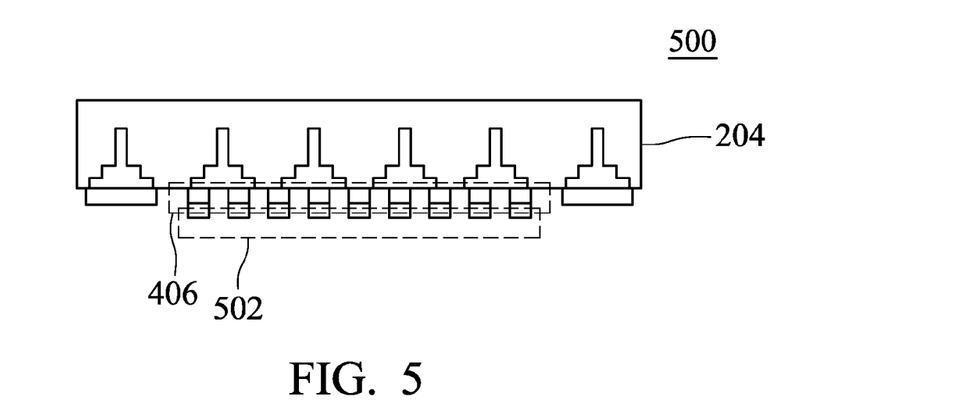
FIGS. 5-8 are diagrams illustrating preparation of an interposer assembly for, and application of, a bottom mounted die.

FIG. 5 illustrates an interposer 204 with RDL structure 402 prepared for die mounting 500. RDL device mounting pads 406 may have bonding pads 502 deposited thereon to facilitate conductive attachment and permit mounting of a die. In one particularly useful embodiment, the bonding pads 502 may be under bump metallization (UBM) structures, which, in turn, may be titanium (Ti), titanium copper nickel (TiCuNi), titanium nitride (TiN), titanium tungsten (TiW), aluminum (Al), chromium (Cr), solder, or any other suitable UBM material. Alternatively, the bonding pads 502 may be electroplated material, such as, but not limited to, nickel gold (NiAu), or may be deposited by any suitable electroless deposition, or other, process, such as, but not limited to, electroless nickel electroless palladium immersion gold (ENEPIG), electroless nickel, or the like.

Figure 6:
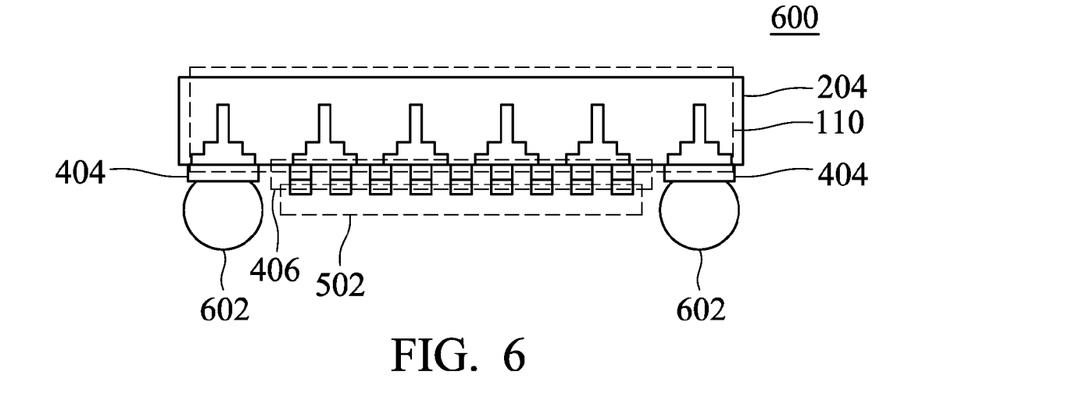

FIG. 6 illustrates application 600 of an interlevel connection structure 602 to the RDL board mounting pad 404. In one useful embodiment, the interlevel connection structure 602 is a solder ball large enough to connect the interposer 204 and associated interposer studs 110 to a target carrier device or board separated from the interposer 204 by a distance sufficient to allow a die or chip to be attached to the RDL device mounting pads 406 between the interposer 204 and the target carrier device.

Figure 7:
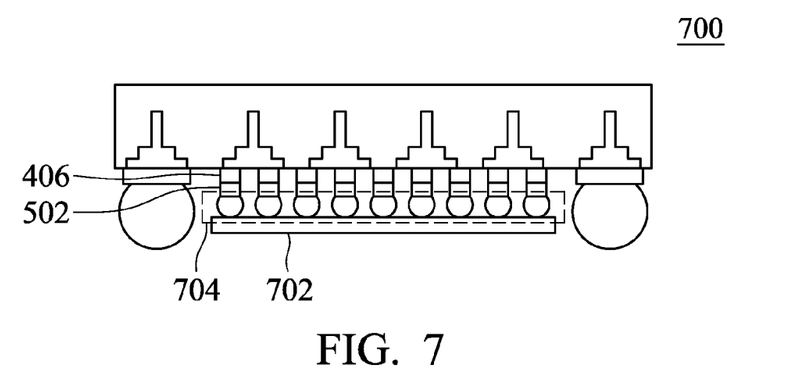

FIG. 7 illustrates an interposer-die assembly 700 having a bottom-mounted die 702. In particularly useful embodiments, a die 702, such as, but not limited to a processing chip, memory or other device may be mounted to the underside of the interposer 204. One system for mounting a die 702 to the interposer may be a solder ball grid array 704, with a solder ball deposited on one or more pins or contacts of the die 702, and then, in turn used to attach the die 702 to the bonding pads 502 and RDL device mounting pads 406. While the presented principles are described herein as using a ball grid array 704 to attach the die 702, any known mounting technique may be advantageously employed to mount a die 702 to the RDL device pads 706, including, but not limited to bump chip carrier (BCC), dual in-line package (DIP), land grid array (LGA), multi-chip module (MCM), quad flat non-leaded package (QFN), quad flat package or the like.

Figure 8:
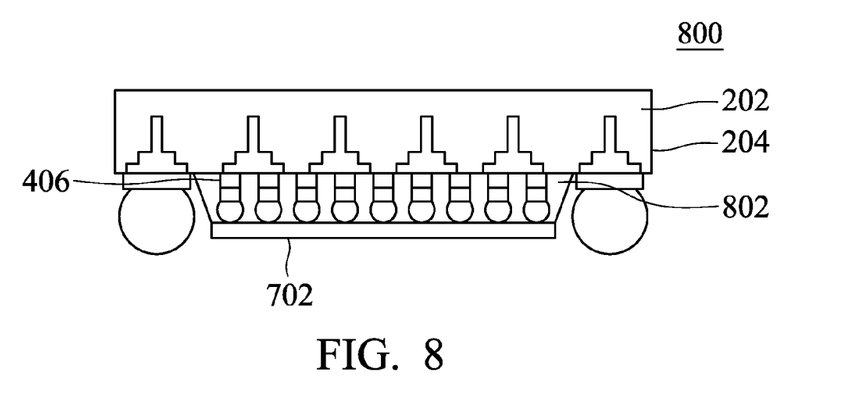

FIG. 8 illustrates an interposer-die assembly 800 with a bottom mounted die 702 having underfilling 802. In particularly useful embodiments, an epoxy underfilling 802 may be applied between the die 702 and interposer 204. This assists in securing the die 702 to the interposer 204, and prevents any connections to the RDL structure from coming loose or breaking under physical stress.

Use of an epoxy underfilling, 802, in combination with an epoxy carrier plane 202, permits matching of the CTE so that the underfilling 802 and carrier plane 202 or interposer 204 expand at generally the same rate in response to temperature changes. Additionally, a die 702 having an epoxy body will permit matching of the die 702 CTE to that of the interposer 204 and underfilling 802. Skilled artisans will recognize that the CTE of ordinary glass is approximately 8.5*ppm/° C. and for borosilicate glass, 3.3*ppm/° C., while the CTE of epoxies can range from 15-100 ppm/° C. While insulating materials like glass or ceramics may be used for the carrier plane 202 of the interposer 204, matching the CTE of the carrier plane 202, die 702 and underfilling 802 is preferable to reduce physical stress on the interconnection of those elements.

However, any combination of materials may be used without deviating from the principles disclosed herein. For example, the underfilling 802 may be eliminated entirely, the die 702 package may be a polymer or plastic, or the carrier plane 202 may be glass, silicon dioxide, or any other dielectric or insulating material.

Figure 9:
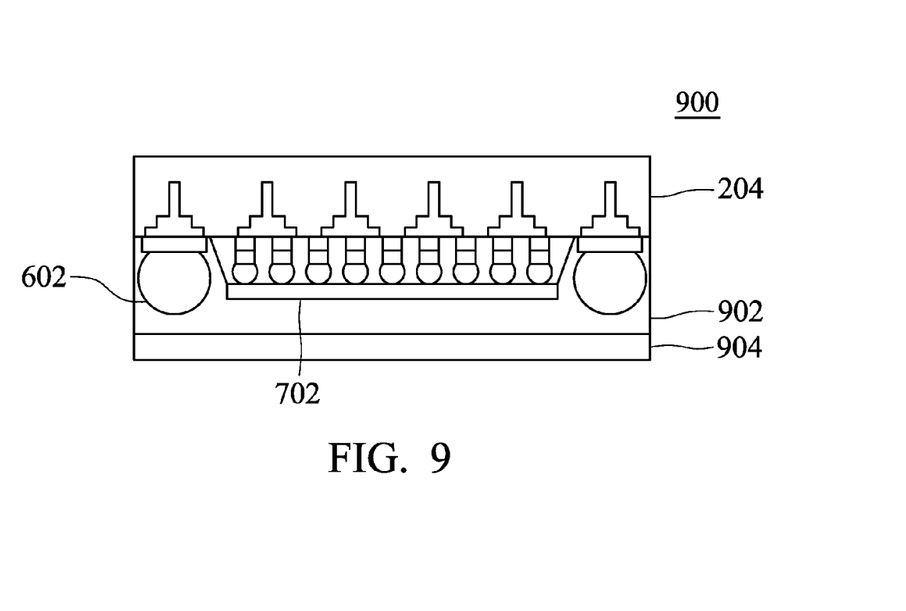
FIGS. 9-11 are diagrams illustrating preparation of an interposer assembly for, and application of, a top mounted die.

FIG. 9 illustrates a mounted interposer-die assembly 900. The interposer-die assembly 900 may optionally be mounted with an adhesive 902 or other filler, to a processing carrier plate 904. This carrier plate 904 may, in one useful embodiment, be used to manage or support the interposer-die assembly 900 while the top side of the assembly 900 is being processed. Additionally, the adhesive 902 may advantageously be applied thick enough to cover and avoid interfering with the interlevel connection structure 602, while providing support for the interposer 204 and die 702. While the processing carrier plate 904 is preferable for holding and supporting the interposer-die assembly 900 for further processing, the interposer-die assembly 900 may be handled in any manner suitable for processing the top features.

Figure 10:
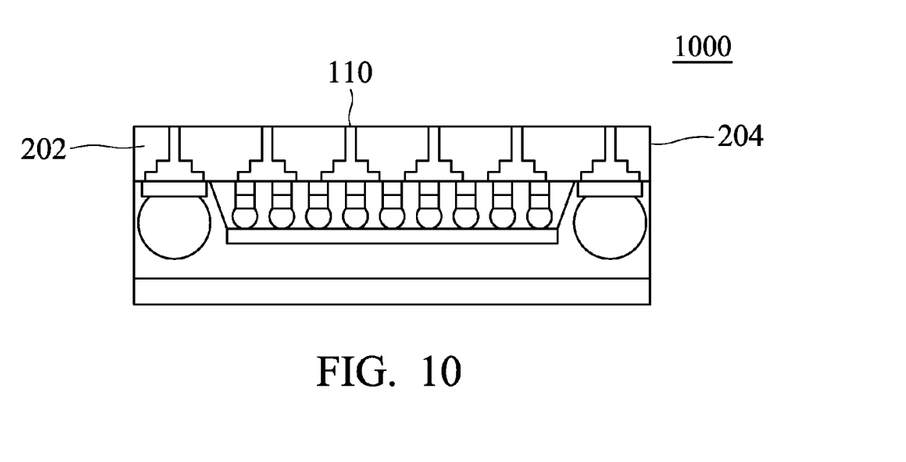

FIG. 10 illustrates preparation of a supported interposer assembly 1000. In particularly useful embodiments, the carrier plane 202 may be ground, polished, or otherwise reduced to expose the interposer studs 110. Alternatively, this reduction step may be eliminated in embodiments where the carrier plane 202 does not cover the interposer studs 110.

Figure 11:
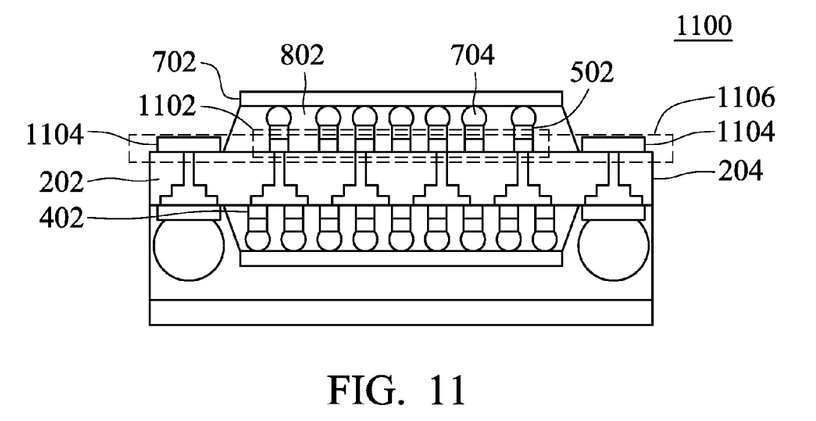

FIG. 11 illustrates processing features on the top side of the interposer assembly 1100. These processing steps for preparing the interposer assembly and attaching a die to the top side may be similar to those performed for the bottom side. An upper RDL structure 1106, consisting or one or more upper RDL device mounting pads 1102 or one or more upper RDL board mounting pads 1104 may be created on the upper surface of the interposer 204. Similar to the formation of the RDL structure 402 on the bottom side of the interposer 204, the upper RDL structure 1106 may be formed by attaching a conductive sheet followed by masking and etching the sheet, or by masking the upper RDL structure 1106 boundaries and depositing conductive material to form the upper RDL structure 1106. Furthermore, bonding pads 502 may be attached to the upper RDL structure 1106 and a die 702 may be attached thereto with a ball grid array 704, or any other suitable die 702 attachment method. An underfilling 802 may also be optionally applied to the die 702 on the upper surface to secure the die 702 to the interposer 204.

Skilled artisans will recognize that the steps for processing features for the top side may be performed before or after the steps for the bottom features. Alternatively, the steps for processing the top and bottom sides of the interposer assembly may be mixed without deviating from the spirit or scope of the presented principles. For example, but without limitation, the RDL structures 402 and 1106 on both top and bottom of the interposer 204 may be created before any bonding pads 502 are applied. Similarly, the bonding pads 502 may be applied to both sides of the interposer 204 before any die 702 is attached.

In order to illustrate an alternative embodiment for forming an interlevel connection structure using device mounting studs, the bonding pads 502 are shown in this figure as being applied only to the upper RDL device mounting pads 1102. However, skilled artisans will recognize that the same method and structure for forming an interlevel connection structure 602, described above, may be advantageously applied to the top of the interposer assembly.

Figure 12:
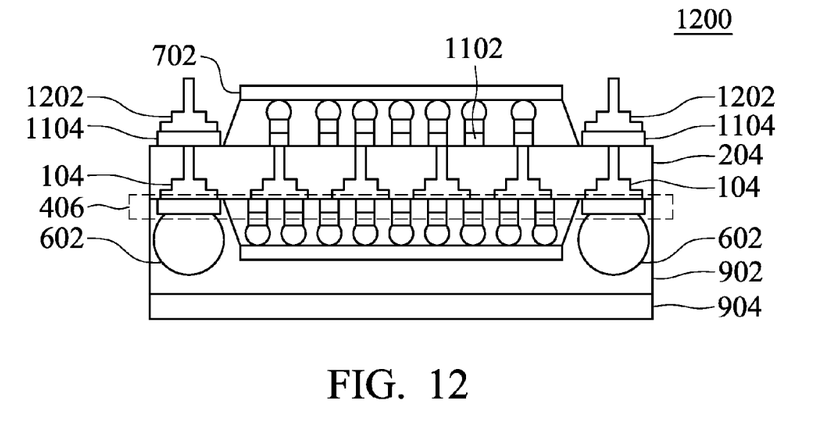
FIGS. 12-15 are diagrams illustrating packaging a double layer interposer.

FIG. 12 illustrates an interposer assembly with attached interlevel mounting studs 1200. The interlevel mounting studs 1202 may be mounted to the upper RDL board mounting pads 1104 by any suitable conductive attachment method. In one particularly useful embodiment, the interlevel mounting studs 1202 are attached to the board mounting studs 104, which are, in turn, attached to the interlevel connection structure 602 on the bottom of the interposer assembly. Thus, a device or board may be mounted over the upper die 702, and may communicate through the conductive path provided by the interlevel mounting stud 1202, board mounting stud 104 and interlevel connection structure 602 to a target carrier board or device upon which the interposer assembly 1300 is mounted. Alternatively, the upper RDL board mounting pads 1104 or lower RDL board mounting pads 406 may be connected via the RDL structure 402 or upper RDL structure 1106 to any upper or lower RDL device mounting pad 406 and 1102. Skilled artisans will recognize that the upper and lower RDL structure 1106 and 402 may connect any die 702 connection pin to any other die 702 connection pin, interlevel connection structure 602 or mounting studs 1202, permitting a die 702 to electrically connect to any other device in the interposer package 1200 or any other connected circuit.

Figure 13:
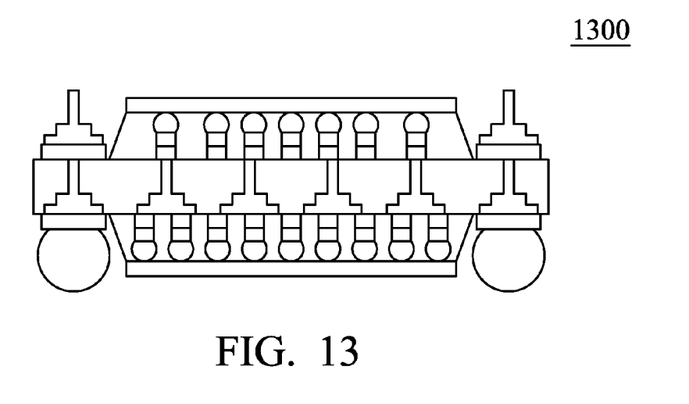

FIG. 13 illustrates an interposer package 1300 with the processing carrier plate 904 and adhesive 902 removed. Debonding the carrier plate 904 and removal of the adhesive 902 may be accomplished by any means, including, but not limited to, physically peeling the carrier plate 904 and adhesive 902 off, grinding the carrier plate 904, dissolving the adhesive 902 with a solvent, or the like. Advantageous debonding methods will avoid damaging the interposer package 1300 and associated structures while completely removing any adhesive 902.

Figure 14:
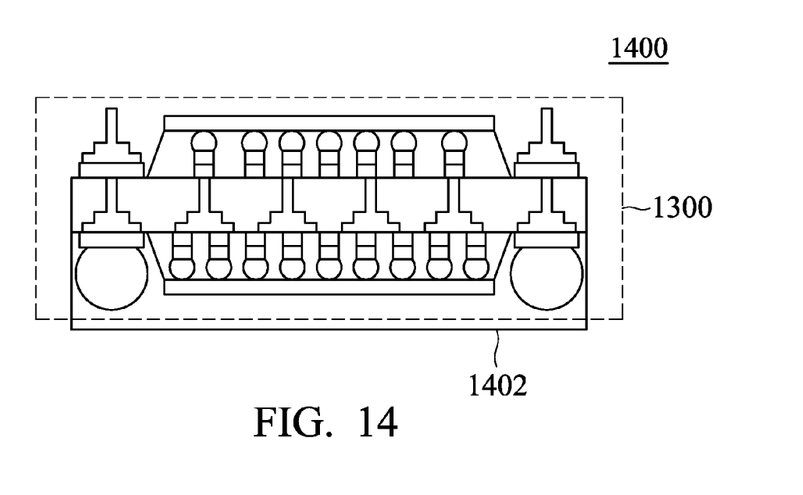

FIG. 14 illustrates an interposer package 1300 mounted on application packaging 1402 and prepared for installation 1400. The application packaging 1402 may be tape, adhesive, or some other carrier suitable for permitting the interposer package 1300 to be handled, processed, or used in automated equipment and mounted to a target carrier board.

Figure 15:
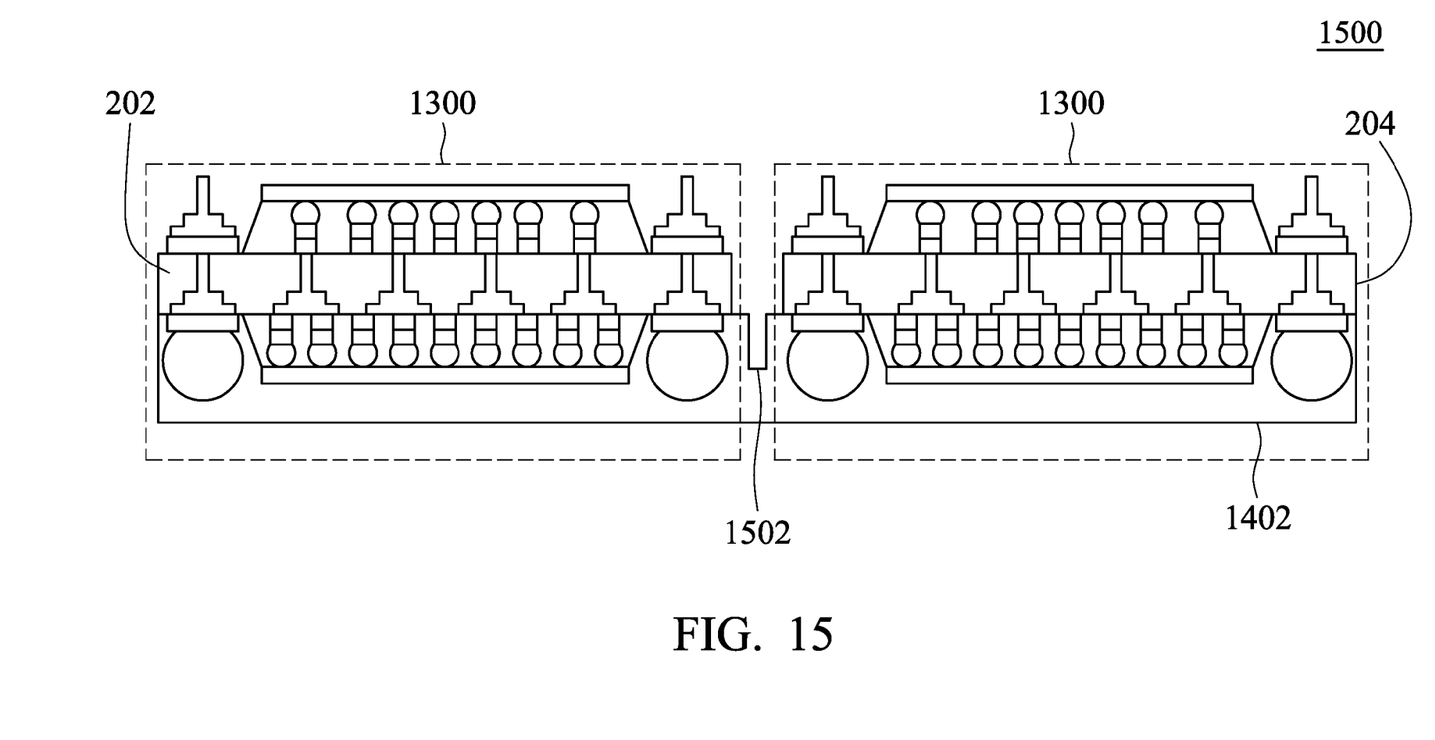

FIG. 15 illustrates singulation of multiple interposer packages 1300 for use in automated equipment 1500. In a production environment, it may be desirable to have multiple interposer packages 1300 on a single carrier for ease of use in automated machinery. In such an embodiment, the interposer packages 1300 may be applied to a strip of flexible tape, or other application packaging 1402, and the application packaging then scored with a singulation feature 1502 that ensures the packaging can be separated at a desirable and repeatable location.

Skilled artisans will recognize that application of the interposer packages 1300 to the application packaging 1402 and singulation may be advantageously done in various ways. In one useful embodiment, multiple interposer packages 1300 on a single interposer carrier plane 202 may be attached to an application packaging 1402 and then separated into individual interposer packages 1300 by cutting or etching the carrier plane 202 to separate each interposer package 1300. Additionally, in such an embodiment, the singulation feature 1502 may be created after the interposer packages 1300 are separated, or the singulation feature 1502, if taking the form of a partial cut in the application packaging 1402, may be formed at the same time as the interposer packages 1300 are separated, with the cutting apparatus making a single cut though the carrier plane 202 and into the application packaging 1402.

Figure 16:
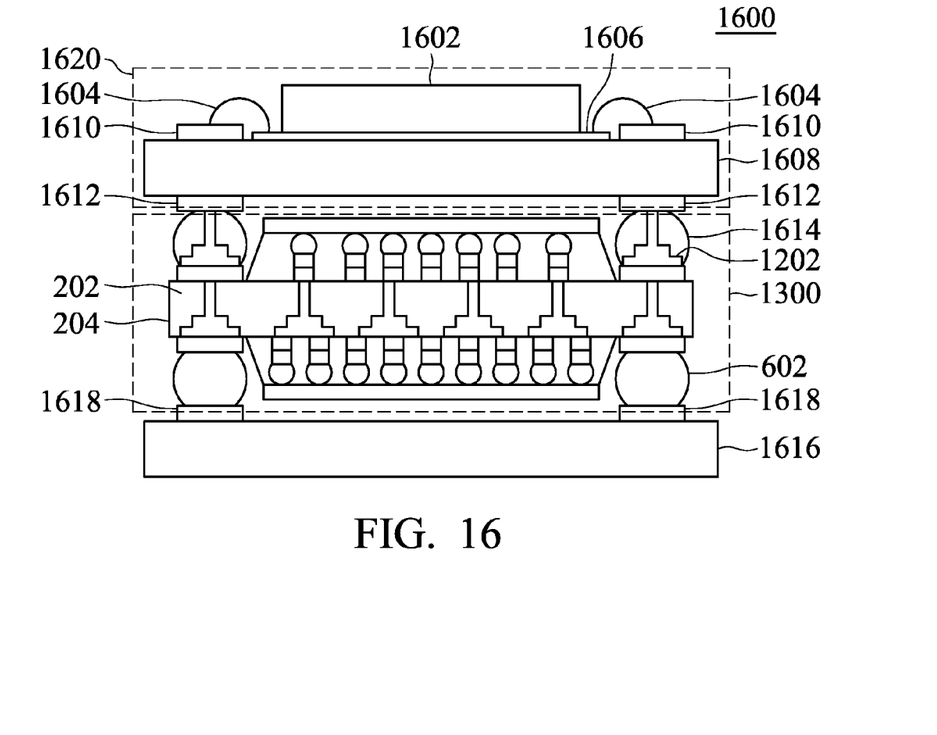
FIG. 16 is diagram illustrating a double layer interposer disposed in a three layer integrated circuit package and mounted on a circuit board.

FIG. 16 illustrates a double layer interposer package 1300 disposed in a three layer integrated circuit package and mounted on a target carrier circuit board 1616 to create four layers of circuits 1600. A PCB 1616 is a common carrier for electronic circuits when multiple devices must be mounted and electrically connected, and may be a target carrier board 1616. An interposer package 1300 may be mounted to the lower PCB, or target carrier board 1616 via the interlevel connection structure 602 on the bottom of the interposer package 1300. A PCB 1616 may have mounting pads or connection points 1618 disposed on the surface of the PCB 1616, and configured to accept a interposer package 1300 for electrical connection. Where solder ball mounting interlevel connection structures 602 are used, the solder ball may connect and adhere directly to the PCB mounting pad 1618, which will secure the interposer package 1300 to the lower PCB 1616 once cooled and solidified. Additionally, the lower PCB mounting pads 1618 may be electrical connections to other circuits or components, permitting the interposer package and attached dies 702 to communicate with the external circuits via the lower PCB 1616.

A top package 1620 may also be included in the overall interposer package 1300 to form a three layer package. An upper PCB 1608 may also be attached to the top of the interposer package 1300, using the interlevel mounting studs 1202, or a solder ball mount 1614, or a combination of the two, with a solder ball 1614 holding the interlevel mounting studs 1202 to the mounting pads 1612 of the upper PCB 1608. The upper PCB may have any combination of devices, circuits or structures. For example, but without limitation, the upper PCB 1608 may have a device such as a memory chip 1602 attached to a mounting pad 1606, and electrically connected to the upper PCB 1608 via a wire bond 1604 by way of a connection point 1610. In such an exemplary embodiment, the dies 702 on the interposer may be logic or processing integrated circuits, interface or touchscreen controllers, communications chips, or the like. Skilled artisans will recognize that the upper PCB 1608 and lower PCB 1616 may have any type of electrical trace mounted thereon, and that PCBs commonly have vias or other connections though the board itself, permitting circuits on each side of the PCB to be in electrical contact.

Thus, a die 702 mounted on the upper side of the interposer 204, a die 702 mounted on the bottom side of the interposer 204, and an integrated circuit 1602 in the top package 1620, may each communicate with any of the others, and with any other connected device via the RDL structures 1106 and 406, interposer studs 110 and interlevel connection structures 602 and 1202.

Figure 17:
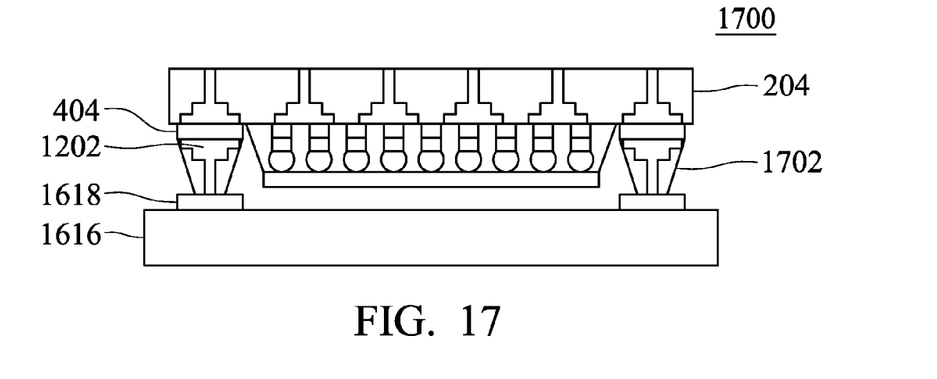
FIG. 17 is a diagram illustrating an interposer assembly mounted on a circuit board having an alternate embodiment of an interlevel connection structure.

The physical arrangement of interlevel mounting studs 1202 may also be varied according to system requirements without deviating from the presented principles. FIG. 17 illustrates an interposer assembly 1700 having an alternative embodiment of an interlevel connection structure 602. An interposer package 1300 may have an interposer stud 1202 mounted on the bottom of the interposer 204, and used with a solder connection 1702 to connect the interposer 204 to a PCB 1616 board mounting pad 1618.

Figure 18:
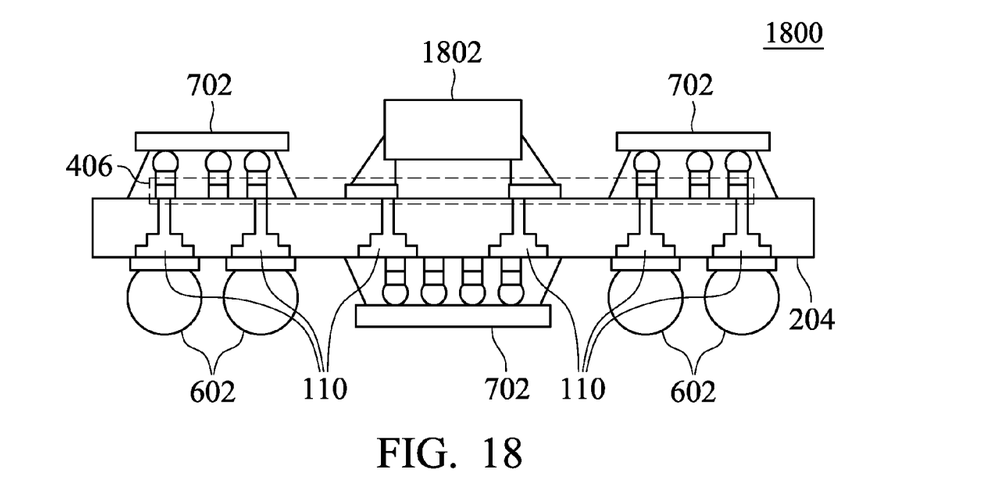
FIG. 18 is a diagram illustrating an alternative embodiment of a interposer assembly.

FIG. 18 illustrates an alternative embodiment of an interposer assembly 1800. In this embodiment, interposer studs 110 in the carrier plane 202 may connect multiple dies 702, or socket mounted dies 1802, to interlevel connection structures 602, permitting dies 702 disposed on the interposer 204 to communication with devices on the opposite side of the interposer 204.

Figure 19:
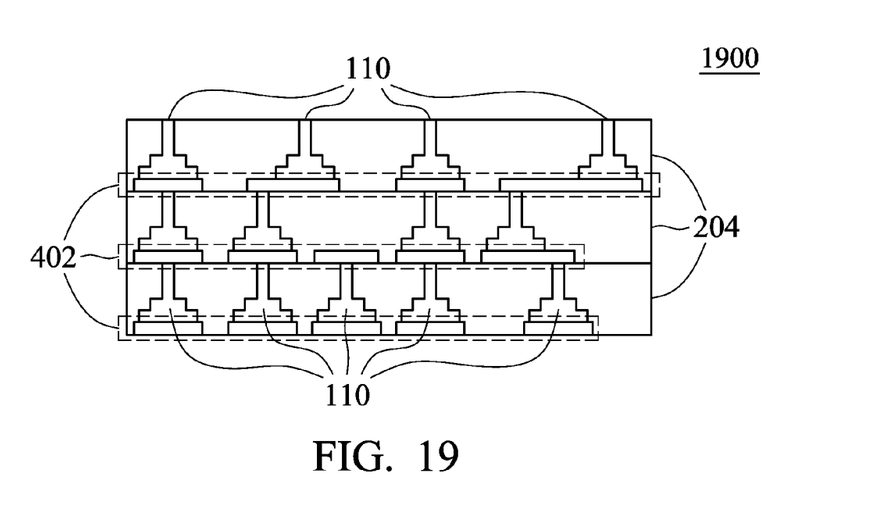
FIG. 19 is a diagram illustrating an alternative embodiment of an interposer arrangement.

FIG. 19 illustrates an alternative embodiment of an interposer arrangement 1900 with multiple stacked interposers 204. In such an embodiment, RDL structures 402 may be disposed within the interposer 204, on the bottom of an interposer 204, or on both surfaces, to remap connections between interposer studs 110 in different interposers. Thus, multiple interposer 204 may be stacked, and a combination of RDL structures 402 and interposers 110 may provide the ability to redirect electrical contacts using one or more predefined interposer 204 designs to customize an electrical connection mapping.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, interposer studs may be solid or hollow, and may be any conductive material, or even a semiconductor material where such material is called for. As another example, it will be readily understood by those skilled in the art that many of the steps may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A device, comprising:
   at least one interposer stud;
   a carrier plane molded around the at least one interposer stud;
   a first redirection layer disposed on a first surface of the carrier plane, the redirection layer in electrical contact with at least one interposer stud;
   a first die mounted to at least a portion of the first redirection layer and in signal communication with at least one interposer stud;
   a second redirection layer on a second surface of the carrier plane opposite the first surface; and
   at least one first interlevel connection structure mounted to at least a portion of the first redirection layer such that at least one first interlevel connection structure is in signal communication with at least one interposer stud and extends above the first die.

2. The device of claim 1, further comprising a second die, at least a portion of the second die mounted to at least a portion of the second redirection layer, the second die in signal communication with at least one interposer stud.

3. The device of claim 2, further comprising:
   at least one second level connection structure mounted to at least a portion of the second redirection layer, the at least one second interlevel connection structure in signal communication with at least one interposer stud; and
   a top package comprising at least one third die and at least one mounting board, the top package mounted to the at least one second interlevel connection structure, the third die of the top package in signal communication with the at least one second interlevel connection structure, the second die disposed between the top package and the carrier plane.

4. The device of claim 1, wherein the first surface of the carrier plane is substantially coplanar with a first end of the at least one interposer stud and wherein the second surface of the carrier plane is substantially coplanar with a second end of the at least one interposer stud.

5. The device of claim 1, wherein the least one interposer stud is a wire interposer stud having a substantially regular cross section along a length of the wire interposer stud.

6. The device of claim 1, wherein a first end of the at least one interposer stud disposed at the first surface of the carrier plane has a greater width than a width of a second end of the at least one interposer stud.

7. The device of claim 1, wherein the carrier plane is a molded epoxy.

8. A device, comprising:
   one or more interposer studs;
   a carrier plane molded around at least one of the one or more interposer studs;
   a first redirection layer disposed on a first surface of the carrier plane, the first redirection layer in electrical contact with at least one interposer stud;
   at least one first die disposed on the first redirection layer and in signal communication with at least one of the one or more interposer studs;
   at least one second die disposed on a second surface of the carrier plane and in signal communication with at least one of the one or more interposer studs and the at least one first die;
   at least one first interlevel connection structure disposed on the first redirection layer and in signal communication with the one or more interposer studs;
   at least one second interlevel connection structure disposed on the second surface of the carrier plane and in signal communication with the at one or more interposer studs and the at least one first die via at least one interposer stud; and
   a top package disposed on the at least one second interlevel connection structure, wherein the top package comprises a third integrated circuit and at least one mounting board, and wherein the third integrated circuit of the top package is in signal communication with the at least one second interlevel connection structure and at the least one first die.

9. The device of claim 8, wherein the carrier plane is a molded epoxy.

10. The device of claim 8, wherein the one or more interposer studs are wire interposer studs welded to the first redirection layer.

11. The device of claim 8, wherein the one or more interposer studs are soldered to the first redirection layer.

12. The device of claim 8, wherein the second interlevel connection structure is a same shape and type as an interposer stud.

13. The device of claim 8, wherein the first interlevel connection structure comprises a stud disposed in a solder connection.

14. An interposer package apparatus, comprising:
   a plurality of first interposer studs;
   at least one carrier plane molded around at least one of the plurality of first interposer studs;
   a first redirection layer structure having at least one device mounting pad and at least one board mounting pad, and disposed on a first surface of the carrier plane, where in at least one of the plurality of first interposer studs is electrically connected to the first redirection layer;
   a second redirection layer structure having at least one device mounting pad and at least one board mounting pad, and disposed on a second surface of the carrier plane opposite the first surface, wherein the second redirection layer is electrically connected to at least one interposer stud;

at least one first integrated circuit die attached to the first redirection layer;

at least one second integrated circuit die attached to the second redirection layer; and at least one second interposer stud attached to a board mounting pad of the second redirection layer, and electrically connected to at least a portion of the first redirection layer, and wherein the at least one second interposer is configured to accept the attachment of a top package and to hold the top package at a first distance from the second integrated circuit die.

15. The apparatus of claim 14, wherein the at least one carrier plane has a thickness between about 200 microns and about 300 microns.

16. The apparatus of claim 14, wherein the apparatus further comprises an underfilling filling a space between the first integrated circuit die and the at least one carrier plane, the underfilling comprises a thermal set epoxy material; and an underfilling filling a space between the second integrated circuit die and the at least one carrier plane, the underfilling comprises the thermal set epoxy material; and wherein the at least one carrier plane comprises the thermal set epoxy material.

17. The apparatus of claim 14, wherein the plurality of first interposer studs are wires bonded to the first redirection layer via a wire bonding welding technique.

18. The apparatus of claim 14, wherein the plurality of first interposer studs are extruded studs soldered to the first redirection layer.

19. The apparatus of claim 14, wherein the at least one carrier plane comprises two or more carrier planes each having one or more interposer studs disposed therein.

20. The apparatus of claim 19, further comprising third redirection layers each disposed between adjacent ones of the two or more carrier planes.

* * * * *